US011289355B2

(12) United States Patent
Gomm (10) Patent No.: US 11,289,355 B2
(45) Date of Patent: Mar. 29, 2022

(54) ELECTROSTATIC CHUCK FOR USE IN SEMICONDUCTOR PROCESSING

(71) Applicant: LAM RESEARCH CORPORATION, Fremont, CA (US)

(72) Inventor: Troy Alan Gomm, Tigard, OR (US)

(73) Assignee: Lam Research Corporation, Fremont, CA (US)

( * ) Notice: Subject to any disclaimer, the term of this patent is extended or adjusted under 35 U.S.C. 154(b) by 464 days.

(21) Appl. No.: 15/612,423

(22) Filed: Jun. 2, 2017

(65) Prior Publication Data

US 2018/0350649 A1 Dec. 6, 2018

(51) Int. Cl.
*H01L 21/683* (2006.01)
*H01J 37/32* (2006.01)
(Continued)

(52) U.S. Cl.
CPC ...... *H01L 21/6833* (2013.01); *C23C 16/4586* (2013.01); *C23C 16/46* (2013.01);
(Continued)

(58) Field of Classification Search
CPC . H01L 21/6833; C23C 16/4586; C23C 16/46; C23C 16/509; H01J 37/32532;
(Continued)

(56) References Cited

U.S. PATENT DOCUMENTS 4,384,918 A 5/1983 Abe
4,692,836 A * 9/1987 Suzuki ................ H01L 21/6831
279/128
(Continued)

FOREIGN PATENT DOCUMENTS

CN 110692131 A 1/2020
JP 63-278322 11/1988
(Continued)

OTHER PUBLICATIONS

International Search Report and Written Opinion dated Sep. 6, 2018 in corresponding International Patent Application No. PCT/US2018/034998, 13 pages.
(Continued)

*Primary Examiner* — Charlee J. C. Bennett
(74) *Attorney, Agent, or Firm* — Weaver Austin Villeneuve & Sampson LLP (57) ABSTRACT

A semiconductor substrate processing apparatus includes a vacuum chamber having a processing zone in which a semiconductor substrate may be processed, a process gas source in fluid communication with the vacuum chamber for supplying a process gas into the vacuum chamber, a showerhead module through which process gas from the process gas source is supplied to the processing zone of the vacuum chamber, and a substrate pedestal module. The substrate pedestal module includes a pedestal made of ceramic material having an upper surface configured to support a semiconductor substrate thereon during processing, a stem made of ceramic material, and coplanar electrodes embedded in the platen, the electrodes including an outer RF electrode and inner electrostatic clamping electrodes, the outer RF electrode including a ring-shaped electrode and a radially extending lead extending from the ring-shaped electrode to a central portion of the platen, wherein the ceramic material of the platen and the electrodes comprise a unitary body made in a single sintering step.

20 Claims, 6 Drawing Sheets

(51) Int. Cl.
  *C23C 16/509* (2006.01)
  *C23C 16/458* (2006.01)
  *C23C 16/46* (2006.01)

(52) U.S. Cl.
  CPC ...... *C23C 16/509* (2013.01); *H01J 37/32532* (2013.01); *H01J 37/32541* (2013.01); *H01J 37/32568* (2013.01); *H01J 37/32697* (2013.01); *H01J 37/32715* (2013.01)

(58) Field of Classification Search
  CPC ........... H01J 37/32541; H01J 37/32568; H01J 37/32697; H01J 37/32715
  USPC ................................................. 118/715–733
  See application file for complete search history.

(56) References Cited

U.S. PATENT DOCUMENTS

| | | | |
|---|---|---|---|
| 5,668,331 | A | 9/1997 | Schintag et al. |
| 5,880,922 | A | 3/1999 | Husain |
| 6,104,596 | A | 8/2000 | Hausmann |
| 6,156,686 | A | 12/2000 | Katsuda et al. |
| 6,303,879 | B1 | 10/2001 | Burkhart |
| 6,483,690 | B1 | 11/2002 | Nakajima et al. |
| 6,860,965 | B1 | 3/2005 | Stevens |
| 6,964,812 | B2 | 11/2005 | Ito et al. |
| 7,701,693 | B2 | 4/2010 | Hattori et al. |
| 8,136,820 | B2 | 3/2012 | Morioka et al. |
| 8,637,194 | B2 | 1/2014 | Long et al. |
| 8,840,754 | B2 | 9/2014 | Hao |
| 8,981,263 | B2 | 3/2015 | Sasaki et al. |
| 9,017,484 | B2 | 4/2015 | Kajihara |
| 9,093,488 | B2 | 7/2015 | Anada et al. |
| 9,202,718 | B2 | 12/2015 | Aikawa et al. |
| 9,418,884 | B2 | 8/2016 | Miyazawa et al. |
| 10,147,610 | B1* | 12/2018 | Lingampalli ..... C23C 16/45514 |
| 10,431,467 | B2* | 10/2019 | Lingampalli ......... C23C 16/045 |
| 2001/0119472 | | 9/2001 | Kanno et al. |
| 2001/0027972 | A1* | 10/2001 | Yamaguchi ............ H05B 3/283 219/468.1 |
| 2002/0027762 | A1 | 3/2002 | Yamaguchi |
| 2005/0045618 | A1 | 3/2005 | Ito |
| 2005/0213279 | A1* | 9/2005 | Hayakawa .......... H01L 21/6833 361/234 |
| 2005/0215415 | A1 | 9/2005 | Hattori |
| 2005/0258160 | A1 | 11/2005 | Goto et al. |
| 2006/0011611 | A1* | 1/2006 | Goto ................. H01L 21/67103 219/444.1 |
| 2007/0042897 | A1 | 2/2007 | Aihara et al. |
| 2007/0223173 | A1* | 9/2007 | Fujisawa ................ H02N 13/00 361/234 |
| 2008/0062609 | A1* | 3/2008 | Himori ............... H01L 21/6833 361/234 |
| 2009/0274590 | A1 | 11/2009 | Willwerth et al. |
| 2009/0283933 | A1 | 11/2009 | Kobayashi et al. |
| 2011/0031217 | A1* | 2/2011 | Himori ............. H01J 37/32165 216/71 |
| 2011/0096461 | A1 | 4/2011 | Yoshikawa et al. |
| 2012/0006493 | A1 | 1/2012 | White et al. |
| 2012/0164834 | A1* | 6/2012 | Jennings ........... H01J 37/32532 438/694 |
| 2013/0001899 | A1 | 1/2013 | Hwang et al. |
| 2013/0220988 | A1 | 8/2013 | Kondo et al. |
| 2013/0284374 | A1 | 10/2013 | Lubomirsky et al. |
| 2014/0117119 | A1 | 5/2014 | Unno et al. |
| 2014/0340813 | A1 | 11/2014 | Anada et al. |
| 2015/0116889 | A1 | 4/2015 | Yamasaki et al. |
| 2016/0002779 | A1* | 1/2016 | Lin ................... H01L 21/67103 118/500 |
| 2016/0148828 | A1 | 5/2016 | Parkhe |
| 2016/0333475 | A1 | 11/2016 | Gomm et al. |
| 2016/0336213 | A1 | 11/2016 | Gomm et al. |
| 2016/0340781 | A1 | 11/2016 | Thomas et al. |
| 2018/0350568 | A1* | 12/2018 | Mitsumori ........ H01J 37/32027 |
| 2019/0355556 | A1* | 11/2019 | Takahashi ......... H01J 37/32724 |

FOREIGN PATENT DOCUMENTS

| | | |
|---|---|---|
| JP | 06-260430 | 9/1994 |
| JP | 07-078766 | 3/1995 |
| JP | 10-326788 | 12/1998 |
| JP | 2004-356624 | 12/2004 |
| JP | 2005-063991 | 3/2005 |
| JP | 2006-295138 | 10/2006 |
| JP | 2012-089694 | 5/2012 |
| WO | 2007-055381 A1 | 5/2007 |

OTHER PUBLICATIONS

Chinese Application Serial No. 201880036474.8, Voluntary Amendment filed Jun. 2, 2020, w/English Claims, 4 pgs.

International Application Serial No. PCT/US2018/034998, International Preliminary Report on Patentability dated Dec. 12, 2019, 8 pgs.

Singaporean Application Serial No. 11201911409, Voluntary Amendment filed Jun. 2, 2020, 15 pgs.

European Application Serial No. 18809325.6, Extended European Search Report, dated Feb. 8, 2021, 9 pgs.

\* cited by examiner

ELECTROSTATIC CHUCK FOR USE IN SEMICONDUCTOR PROCESSING

FIELD OF THE INVENTION

This invention pertains to semiconductor substrate processing apparatuses for processing semiconductor substrates, and may find particular use in plasma-enhanced chemical vapor depositions processing apparatuses operable to deposit thin films.

BACKGROUND

Semiconductor substrate processing apparatuses are used to process semiconductor substrates by techniques including etching, physical vapor deposition (PVD), chemical vapor deposition (CVD), plasma-enhanced chemical vapor deposition (PECVD), atomic layer deposition (ALD), plasma-enhanced atomic layer deposition (PEALD), pulsed deposition layer (PDL), plasma-enhanced pulsed deposition layer (PEPDL), and resist removal. One type of semiconductor substrate processing apparatus is a plasma processing apparatus that includes a reaction chamber containing upper and lower electrodes wherein a radio frequency (RF) power is applied between the electrodes to excite a process gas into plasma for processing semiconductor substrates in the reaction chamber.

SUMMARY

Disclosed herein is a semiconductor substrate processing apparatus for processing semiconductor substrates, comprising a vacuum chamber including a processing zone in which a semiconductor substrate may be processed; a process gas source in fluid communication with the vacuum chamber for supplying a process gas into the vacuum chamber; a showerhead module through which process gas from the process gas source is supplied to the processing zone of the vacuum chamber; and a substrate pedestal module including a platen made of ceramic material having an upper surface configured to support a semiconductor substrate thereon during processing; a stem made of ceramic material having an upper stem flange that supports the platen; and coplanar electrodes embedded in the platen, the electrodes including an outer RF electrode and inner electrostatic clamping electrodes, the outer RF electrode including a ring-shaped electrode and at least one radially extending lead extending from the ring-shaped electrode to a central portion of the platen, wherein the ceramic material of the platen and the electrodes comprise a unitary body made in a single sintering step.

According to an embodiment, the platen includes first and second D-shaped electrostatic clamping electrodes inward of the ring-shaped electrode, the radially extending lead extending diagonally across the platen and connected to the ring-shaped electrode at two locations 180° apart with the first and second D-shaped electrodes on opposite sides of the radially extending lead. The platen can include a first terminal at a center of the platen, a second terminal radially offset from the first terminal, and a third terminal radially offset from the first terminal, the first terminal electrically connected to the radially extending lead of the ring-shaped electrode, the second terminal electrically connected to the first D-shaped electrode and the third terminal electrically connected to the second D-shaped electrode. The first, second and third terminals can extend axially through openings in the platen and the second and third terminals can be aligned along a diagonal line passing through the location of the first terminal.

In another arrangement, the platen can include first, second, third and fourth electrostatic clamping electrodes inward of the ring-shaped electrode, the at least one radially extending feed strip comprising two feed strips extending diagonally across the platen, each of the feed strips connected to the ring-shaped electrode at two locations 180° apart, the feed strips intersecting at the center of the platen with the first, second, third and fourth electrostatic clamping electrodes located between the diagonally extending feed strips.

The platen can be made of any suitable ceramic material and the electrodes can be made of any suitable electrically conductive material. For example, the platen can be made of aluminum nitride and the electrodes can be made of tungsten. The platen can include three through holes configured to receive lift pins and the platen can have a diameter of at least 300 mm.

In the embodiment wherein the electrostatic clamping electrodes are D-shaped electrodes, the ring-shaped electrode can be separated from the D-shaped electrodes by a first continuous wall of ceramic material extending around the first D-shaped electrode and a second continuous wall of ceramic material extending around the second D-shaped electrode. The first and second walls of ceramic material can have the same width with the width of the first and second walls of ceramic material being less than a width of the radially extending lead.

Also disclosed herein is an electrostatic chuck useful for processing semiconductor substrates in a vacuum chamber including a processing zone in which a semiconductor substrate may be processed. The electrostatic chuck comprises a platen made of ceramic material having an upper surface configured to support a semiconductor substrate thereon during processing and coplanar electrodes embedded in the platen. The electrodes include an outer RF electrode and inner electrostatic clamping electrodes, the outer RF electrode including a ring-shaped electrode and at least one radially extending lead extending from the ring-shaped electrode to a central portion of the platen, wherein the ceramic material of the platen and the electrodes comprise a unitary body made in a single sintering step.

DETAILED DESCRIPTION

In the following detailed description, numerous specific embodiments are set forth in order to provide a thorough understanding of the apparatus and methods disclosed herein. However, as will be apparent to those skilled in the art, the present embodiments may be practiced without these specific details or by using alternate elements or processes. In other instances, well-known processes, procedures, and/or components have not been described in detail so as not to unnecessarily obscure aspects of embodiments disclosed herein. As used herein the term "about" refers to ±10%.

As indicated, present embodiments provide apparatus and associated methods for processing a semiconductor substrate in a semiconductor substrate processing apparatus such as a chemical vapor deposition apparatus or a plasma-enhanced chemical vapor deposition apparatus. The apparatus and methods are particularly applicable for use in conjunction with high temperature processing of semiconductor substrates such as a high temperature deposition processes wherein a semiconductor substrate being processed is heated to temperatures greater than about 550° C., such as about 550° C. to about 650° C. or more.

Embodiments disclosed herein are preferably implemented in a plasma-enhanced chemical deposition apparatus (i.e. PECVD apparatus, PEALD apparatus, or PEPDL apparatus), however, they are not so limited.

Figure 1:
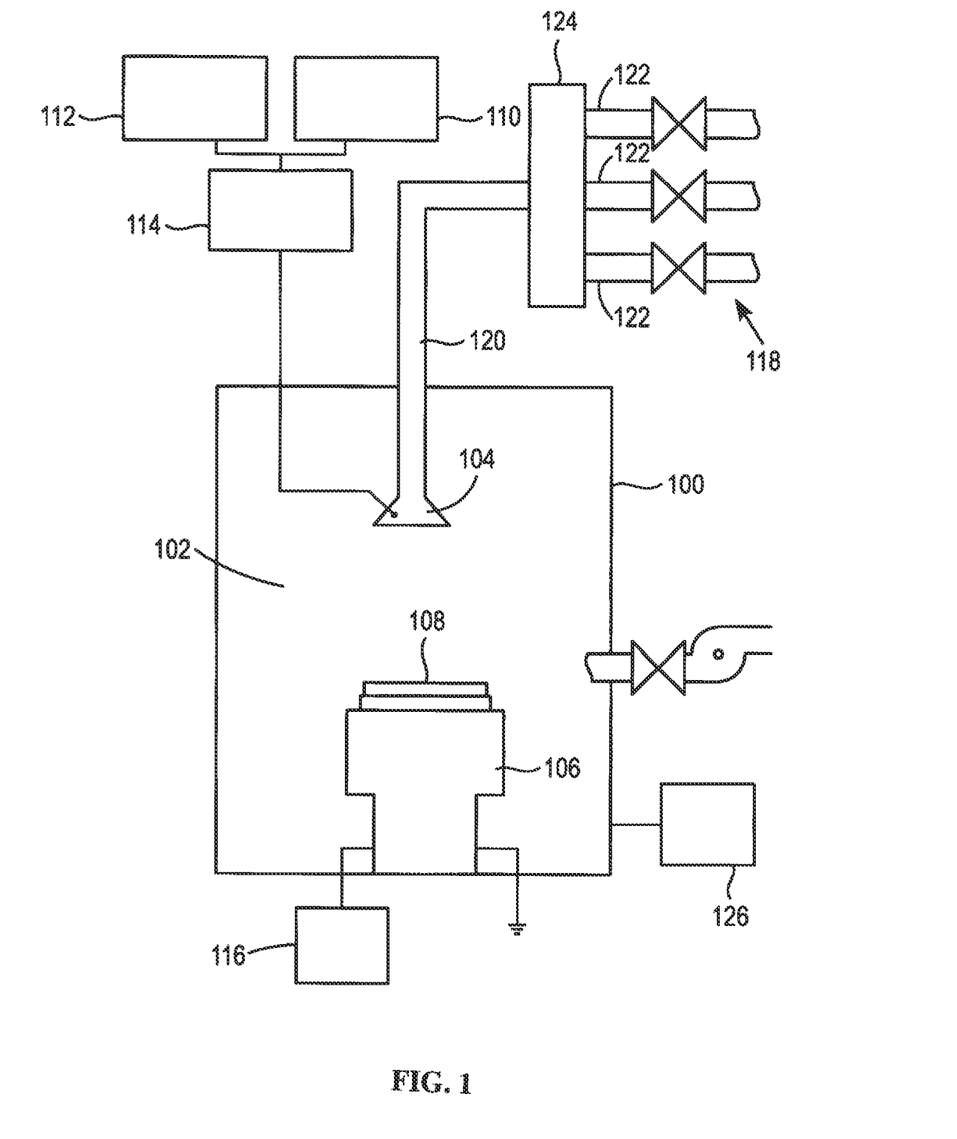
FIG. 1 illustrates a schematic diagram showing an overview of a chemical deposition apparatus in accordance with embodiments disclosed herein.

FIG. 1 provides a simple block diagram depicting various semiconductor substrate plasma processing apparatus components arranged for implementing embodiments as disclosed herein. As shown, a semiconductor substrate plasma processing apparatus 100 includes a vacuum chamber 102 that serves to contain plasma in a processing zone, which is generated by a capacitor type system including a showerhead module 104 having an upper RF electrode (not shown) therein working in conjunction with a substrate pedestal module 106 having a lower RF electrode (not shown) therein. At least one RF generator is operable to supply RF energy into a processing zone above an upper surface of a semiconductor substrate 108 in the vacuum chamber 102 to energize process gas supplied into the processing zone of the vacuum chamber 102 into plasma such that a plasma deposition process may be performed in the vacuum chamber 102. For example, a high-frequency RF generator 110 and a low-frequency RF generator 112 may each be connected to a matching network 114, which is connected to the upper RF electrode of the showerhead module 104 such that RF energy may be supplied to the processing zone above the semiconductor substrate 108 in the vacuum chamber 102.

The power and frequency of RF energy supplied by matching network 114 to the interior of the vacuum chamber 102 is sufficient to generate plasma from the process gas. In an embodiment both the high-frequency RF generator 110 and the low-frequency RF generator 112 are used, and in an alternate embodiment, just the high-frequency RF generator 110 is used. In a process, the high-frequency RF generator 110 may be operated at frequencies of about 2-100 MHz; in a preferred embodiment at 13.56 MHz or 27 MHz. The low-frequency RF generator 112 may be operated at about 50 kHz to 2 MHz; in a preferred embodiment at about 350 to 600 kHz. The process parameters may be scaled based on the chamber volume, substrate size, and other factors. Similarly, the flow rates of process gas, may depend on the free volume of the vacuum chamber or processing zone.

An upper surface of the substrate pedestal module 106 supports a semiconductor substrate 108 during processing within the vacuum chamber 102. The substrate pedestal module 106 can include a chuck to hold the semiconductor substrate and/or lift pins to raise and lower the semiconductor substrate before, during and/or after the deposition and/or plasma treatment processes. In an alternate embodiment, the substrate pedestal module 106 can include a carrier ring to raise and lower the semiconductor substrate before, during and/or after the deposition and/or plasma treatment processes. The chuck may be an electrostatic chuck, a mechanical chuck, or various other types of chuck as are available for use in the industry and/or research, Details of a lift pin assembly for a substrate pedestal module including an electrostatic chuck can be found in commonly-assigned U.S. Pat. No. 8,840,754, which is incorporated herein by reference in its entirety. Details of a carrier ring for a substrate pedestal module can be found in commonly-assigned U.S. Pat. No. 6,860,965, which is incorporated herein by reference in its entirety. A backside gas supply 116 is operable to supply a heat transfer gas or purge gas through the substrate pedestal module 106 to a region below a lower surface of the semiconductor substrate during processing. The substrate pedestal module 106 includes the lower RF electrode therein wherein the lower RF electrode is preferably grounded during processing, however in an alternate embodiment, the lower RF electrode may be supplied with RF energy during processing.

To process a semiconductor substrate in the vacuum chamber 102 of the semiconductor substrate plasma processing apparatus 100, process gases are introduced from a process gas source 118 into the vacuum chamber 102 via inlet 120 and showerhead module 104 wherein the process gas is formed into plasma with RF energy such that a film may be deposited onto the upper surface of the semiconductor substrate. In an embodiment, multiple source gas lines 122 may be connected to a heated manifold 124. The gases may be premixed or supplied separately to the chamber. Appropriate valving and mass flow control mechanisms are employed to ensure that the correct gases are delivered through the showerhead module 104 during semiconductor substrate processing. During the processing, a backside heat transfer gas or purge gas is supplied to a region below a lower surface of the semiconductor substrate supported on the substrate pedestal module 102. Preferably, the processing is at least one of chemical vapor deposition processing, plasma-enhanced chemical vapor deposition processing, atomic layer deposition processing, plasma-enhanced atomic layer deposition processing, pulsed deposition layer processing, or plasma-enhanced pulsed deposition layer processing.

In certain embodiments, a system controller 126 is employed to control process conditions during deposition, post deposition treatments, and/or other process operations. The controller 126 will typically include one or more memory devices and one or more processors. The processor may include a CPU or computer, analog and/or digital input/output connections, stepper motor controller boards, etc.

In certain embodiments, the controller 126 controls all of the activities of the apparatus. The system controller 126 executes system control software including sets of instructions for controlling the timing of the processing operations, frequency and power of operations of the low-frequency RF generator 112 and the high-frequency RF generator 110, flow rates and temperatures of precursors and inert gases and their relative mixing, temperature of a semiconductor substrate 108 supported on an upper surface of the substrate pedestal module 106 and a plasma exposed surface of the showerhead module 104, pressure of the vacuum chamber 102, and other parameters of a particular process. Other computer programs stored on memory devices associated with the controller may be employed in some embodiments.

High temperature chucks typically include a ceramic pedestal and a smaller diameter ceramic stem joined to the underside of the platen. See, for example, commonly-assigned U.S. Patent Publication Nos. 2016/0340781; 2016/0336213; and 2016/0333475, each of which is hereby incorporated by reference in its entirety.

Figure 2:
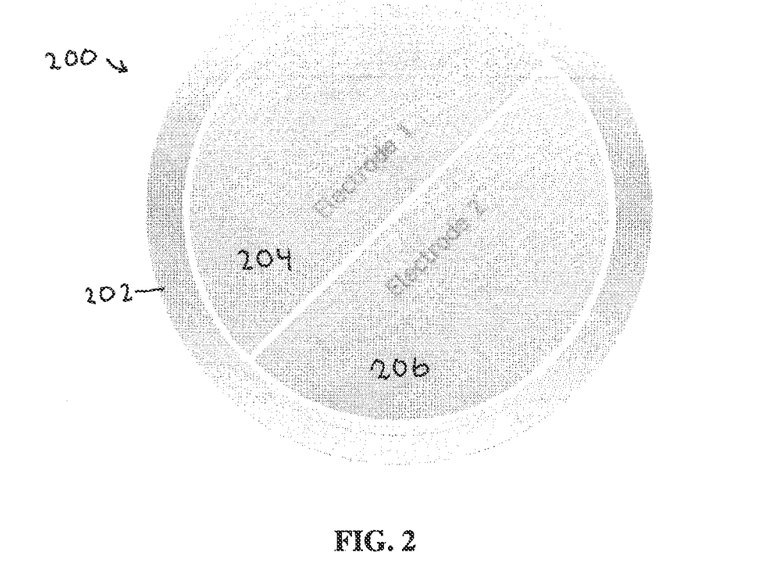
FIG. 2 shows a top view of a ceramic high temperature chuck wherein a power distribution circuit is located below three coplanar electrodes.
Figure 3:
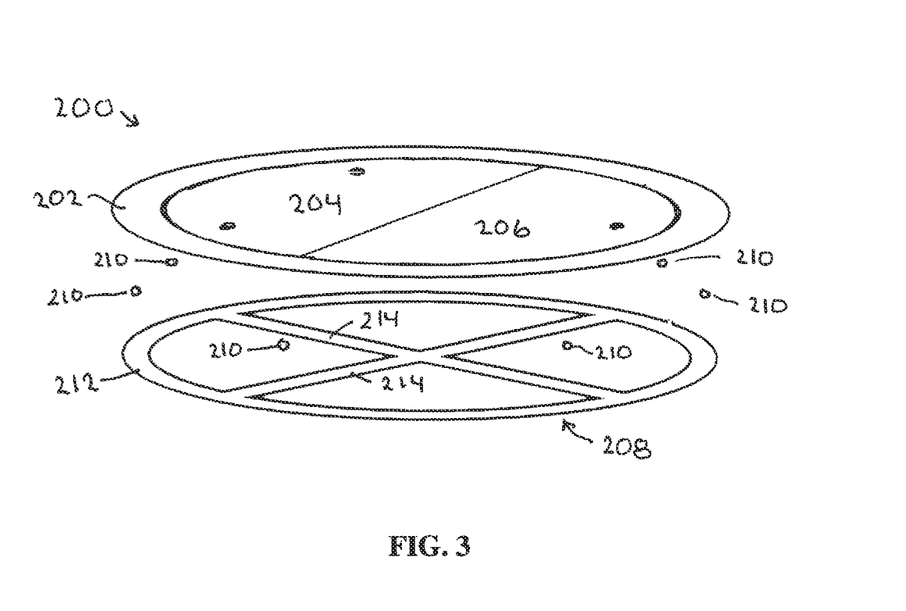
FIG. 3 is an exploded view of the coplanar electrodes shown in FIG. 2 and a power distribution circuit below the electrodes.

FIG. 2 shows a platen 200 having three co-planar electrodes 202, 204, 206 embedded in a ceramic body (not shown). Electrode 202 is an outer ring-shaped electrode which surrounds D-shaped electrostatic clamping electrodes 204 and 206. In order to supply power to the outer ring-shaped electrode 202, a power distribution circuit 208 (see FIG. 3) is embedded in the ceramic body below the electrodes 202, 204, 206 and vertically extending conductive vias 210 connect the outer ring electrode 202 to the power distribution circuit 208. The power distribution circuit 208 includes an outer ring 212 underlying the outer ring-shaped electrode 202 and arms 214 extending diagonally across the outer ring 212. The power distribution circuit 208 allows power to be fed from a power feed terminal (not shown) located near the center of the underside of the platen. The electrostatic clamping electrodes 204, 206 are connected to power feed terminals (not shown) located near the center of the underside of the platen in spaces between the arms 214 of the power distribution circuit 208.

Figure 4:
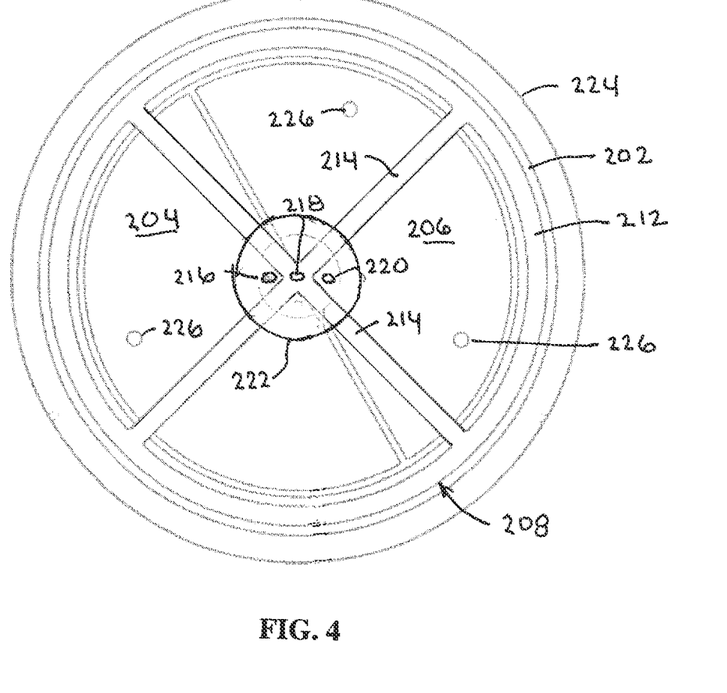
FIG. 4 is a bottom view of the chuck shown in FIG. 3.

FIG. 4 shows an underside of the platen 200 wherein the arrangement of electrodes 202, 204, 206 can be seen along with terminals 216, 218, 220 located inside hollow ceramic stem 222 attached to ceramic body 224. Terminal 216 is attached to electrostatic clamping electrode 204, terminal 220 is attached to electrostatic clamping electrode 206, and terminal 218 is attached to the intersection of arms 214 of power distribution circuit 208. Thus, to manufacture the platen 200, it is necessary to carry out multiple sintering steps to embed the conductive power distribution circuit in the ceramic body 224 below the electrodes 202, 204, 206 with the result that the arms 214 and ring 212 can act as inductors and create undesired inductance effects during processing of a wafer. The ceramic body 224 includes three through holes 226 sized for passage of lift pins (not shown) for lifting and lowering a wafer onto a support surface of the platen 200.

Figure 5:
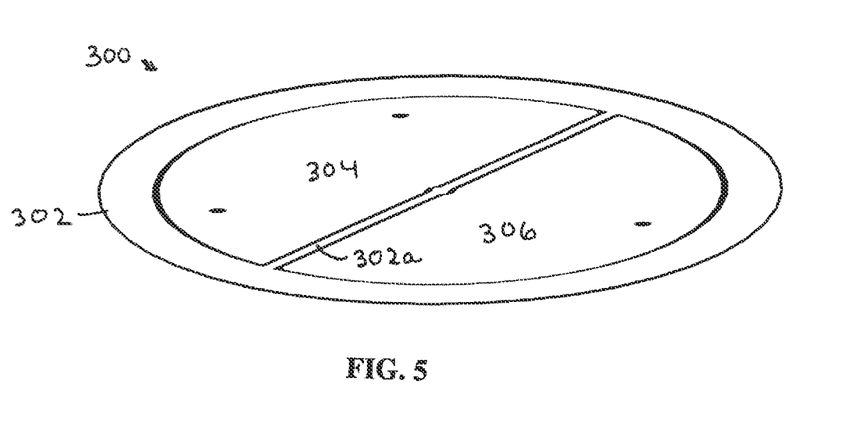
FIG. 5 is a top perspective view of a ceramic high temperature electrostatic chuck wherein an outer ring-shaped electrode includes a radially extending lead which can be electrically connected to a centrally located terminal on an underside of the chuck.

FIG. 5 shows an electrostatic chuck comprising platen 300 having an outer ring-shaped electrode 302 surrounding electrostatic clamping electrodes 304, 306. The outer ring-shaped electrode 302 is designed in a way which obviates the need for a power distribution circuit. As shown, the outer ring-shaped electrode 302 includes a radially extending lead (power feed strip) 302a which extends diagonally across the ring-shaped electrode 302. The lead 302a allows a terminal (not shown) at a center of the underside of the platen 300 to be electrically connected to the outer ring-shaped electrode 302. The electrostatic chuck is preferably a bipolar chuck with one or more pairs of clamping electrodes having opposed polarities. For instance, the electrostatic chuck can include four clamping electrodes separated by feed strips extending diagonally across the outer ring-shaped electrode 302. In such case, the feed strips would be perpendicular and the clamping electrodes would be located inside the four quadrant shaped spaces formed by the outer ring-shaped electrode 302 and the diagonally extending feed strips.

Figure 6:
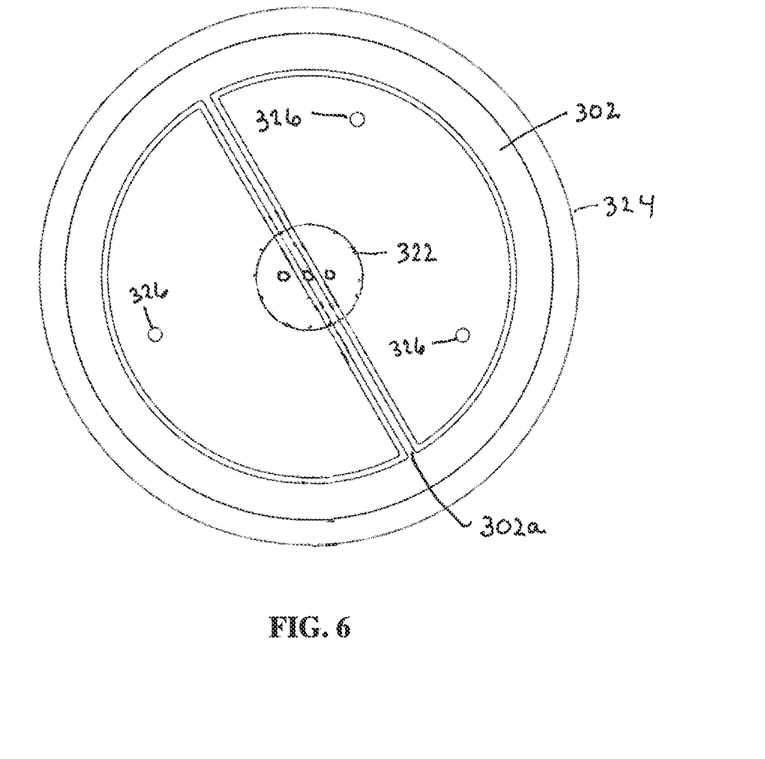
FIG. 6 is a bottom perspective view of the chuck shown in FIG. 5.

FIG. 6 shows an underside of the platen 300 wherein a hollow ceramic stem 322 is attached to ceramic body 324. Terminal 316 is attached to electrostatic clamping electrode 304, terminal 320 is attached to electrostatic clamping electrode 306, and terminal 318 is attached to lead 302a of the ring-shaped outer electrode 302. The ceramic body 324 includes three through holes 326 sized for passage of lift pins (not shown) for lifting and lowering a wafer onto a support surface of the platen 300.

The platen 300 can be used as a high temperature electrostatic chuck of a substrate support module for sequential processing of individual semiconductor wafers wherein the platen 300 is a unitary body made in a single sintering step to provide coplanar electrostatic clamping and RF electrodes and one or more heaters below the coplanar electrodes. As mentioned above, in prior platen designs, an embedded power distribution circuit below the RF and electrostatic clamping electrodes included power distribution electrode arms which created undesirable inductance effects during wafer processing. By eliminating the power distribution electrode arms, it is possible to eliminate out-of-plane inductors and simplify the manufacturing process by conducting a single sintering step. In addition, by providing a feed strip 302 which extends diagonally across the outer ring-shaped electrode 302, it is possible to minimize adverse effects of disturbances to the RF field above the wafer being processed.

The pedestal 300 and stem 322 are preferably of ceramic material and a bottom surface of the pedestal 300 can be joined to a flange at an upper end of the stem 322 such as by brazing, friction welding, diffusion bonding, or other suitable technique. The interior of the stem 322 can include power supply leads, one or more thermocouple leads, and one or more gas supply tubes which supply an inert gas such as argon (Ar) or a heat transfer gas such as helium (He) which is delivered via suitable fluid passages to an underside of a semiconductor substrate located on support surface.

The power leads can be one or more feed rods which supply radio-frequency (RF), direct current (DC) and/or alternating current (AC) to electrodes embedded in the pedestal 300. The pedestal 300 is preferably a unitary body of sintered ceramic material such as aluminum oxide (alumina), yttria, aluminum nitride, boron nitride, silicon oxide, silicon carbide, silicon nitride, titanium oxide, zirconium oxide, or other suitable material or combination of materials. Each electrode preferably has a planar configuration and is preferably made of an electrically conductive metallic material (e.g., tungsten, molybdenum, tantalum, niobium, cobalt) or electrically conductive non-metallic material (e.g., aluminum oxide-tantalum carbide, aluminum oxide-silicon carbide, aluminum nitride-tungsten, aluminum nitride-tantalum, yttrium oxide-molybdenum). The electrodes can be formed from powder materials which are co-fired with the ceramic material of the pedestal. For example, the electrodes can be formed of conductive paste which is co-fired with layers of the ceramic material forming the body of the pedestal. For example, the paste can include conductive metal powder of nickel (Ni), tungsten (W), molybdenum (Mo), titanium (Ti), manganese (Mn), copper (Cu), silver (Ag), palladium (Pd), platinum (Pt), rhodium (Rh). Alternatively, the electrodes can be formed from a deposited material having a desired electrode pattern or a deposited film which is etched to form a desired electrode pattern. Still yet, the electrodes can comprise preformed grids, plates, wire mesh, or other suitable electrode material and/or configuration. In an embodiment, the electrodes include at least one electrostatic clamping electrode which is powered by a DC power source to provide DC chucking voltage (e.g., about 200 to about 2000 volts), at least one RF electrode powered by a RF power source to provide RF bias voltage (e.g., one or more frequencies of about 400 KHz to about 60 MHz at power levels of about 50 to about 3000 watts) and/or at least one electrode powered by DC and RF power sources via suitable circuitry.

The platen can be made by arranging coplanar electrodes in ceramic material and conducting a single sintering step to embed the electrodes in the sintered ceramic material. Examples of techniques for manufacturing ceramic chucks can be found in commonly-assigned U.S. Pat. Nos. 5,880,922; 6,483,690; and 8,637,194, the disclosures of which are hereby incorporated by reference. For example, the outer ring-shaped electrode with integral radially extending lead and the ESC electrodes can be screen printed on a green sheet of aluminum nitride, a green sheet of aluminum nitride or other suitable dielectric material can be placed over the screen printed electrodes, and the resulting compact can be heated pressed and sintered to form the platen. Terminals in holes extending into the underside of the sintered ceramic material can be bonded to each of the electrodes and the stem can be bonded to the underside of the platen.

Figure 7:
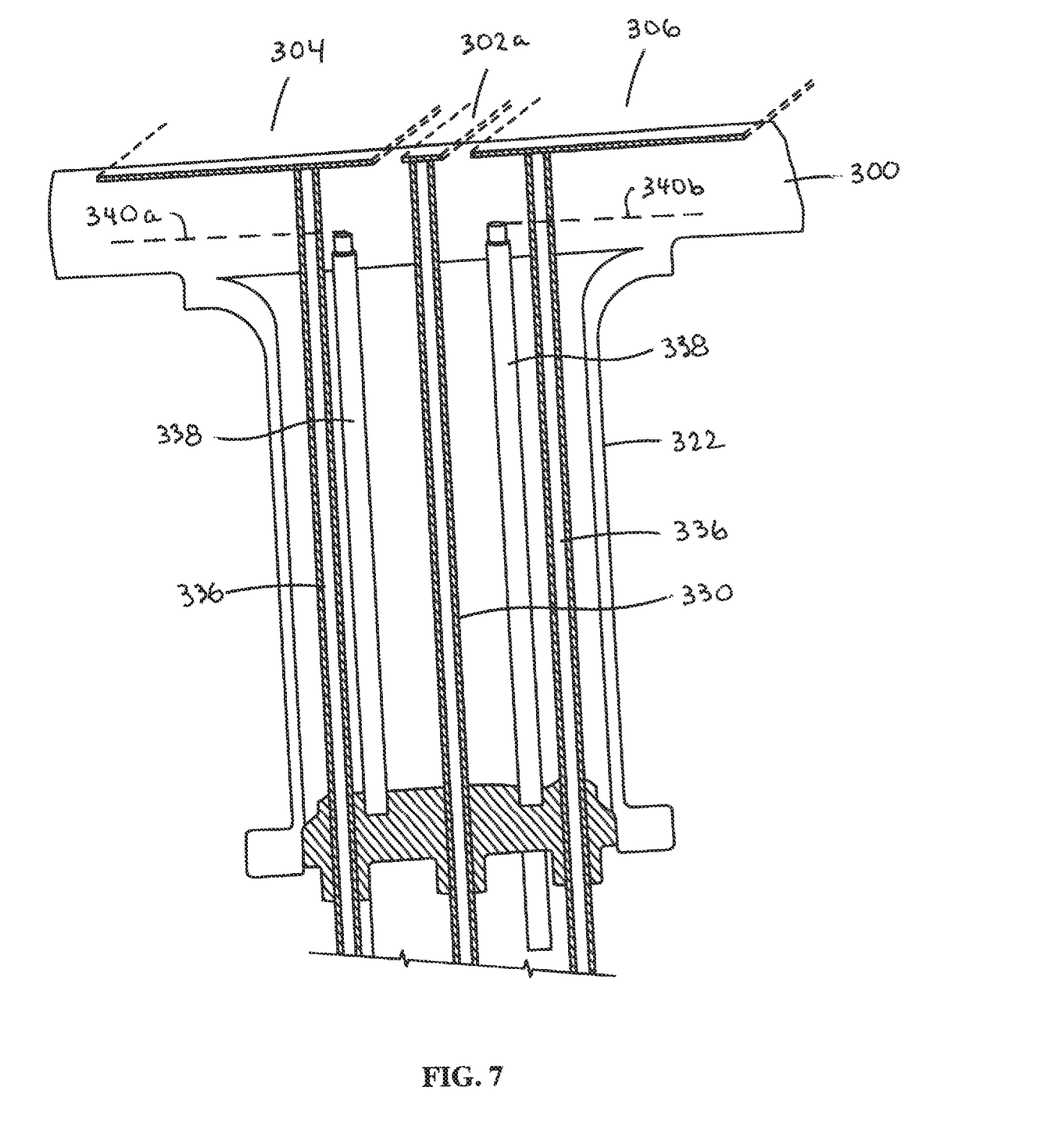
FIG. 7 is a cutaway view showing electrical connections of the platen shown in FIG. 5.

FIG. 7 illustrates a platen 300 which includes electrically conductive electrodes 304, 306 such as an electrically conductive grids and feed strip electrode 302a which is electrically connected to an outer ring-shaped electrode 302 (not shown) embedded therein and a hollow ceramic support stem 322. The platen 300 and stem 322 are preferably made of a ceramic material such as aluminum nitride and a bottom surface of the platen 300 is joined to an upper end of the stem 322 such as by brazing, friction welding, diffusion bonding, or other suitable technique. A centrally located electrically conductive tube 330 is located inside the stem 322 with an upper end of the tube 330 electrically connected to embedded feed strip electrode 302a. An outlet of the tube 330 is in fluid communication with a gas passage 342 in an upper surface of the platen 300. The tube 330 can be supplied an inert gas such as argon(Ar) or nitrogen ($N_2$) or a heat transfer gas such as helium (He) which is delivered via gas passage 342 to an underside of a semiconductor substrate (not shown) supported on the platen 300. The outer surface of the tube 330 can be sealed to the platen 300 by a hermetic seal 332. The inside of the stem 322 also houses other components such as electrical feed rods 338 which deliver power to other electrodes such as resistance heaters 340a, 340b and additional feed rods 336 which deliver power to electrostatic clamping electrodes 304, 306 in the platen 300. The rods 336 can be hollow for deliver gas through outlets to the underside of a wafer supported on the pedestal 300.

During processing of a semiconductor substrate such as deposition of films on a silicon wafer supported on the platen 300, the platen 300 may cycle between temperatures ranging from about 20° C. to 500° c. and higher. For processing a 300 mm wafer, the platen 300 can have a thickness of up to about 1 inch and a diameter of about 15 inches, the stem 322 can have a diameter of about 3 inches and the distance between the bottom of the stem 322 and the upper surface of the platen 300 can be about 5 inches. The tubes 330, 336 can have a diameter of about 4 mm, a length of about 7 to 8 inches. The inside of the stem 322 accommodates components such as electrical feeds such as palladium/rhodium (Pd/Rh) coated stainless steel or nickel (Ni) rods.

The feed rods 338 can be solid metal rods such as nickel (Ni) rods arranged at circumferentially spaced apart locations inward of an inner surface of the stem 322, and the two outer electrically conductive feed rods 336 (which can optionally be hollow rods to deliver gas to the upper surface of platen 300) are electrically connected to electrostatic clamping electrodes 304, 306. The solid feed rods 338 can supply power to resistance heaters 340a, 340b embedded in the platen 300 at a location below the electrostatic clamping electrodes 304, 306. Electrical connections between the central tube 330 and feed strip 302a, between the feed rods 336 and the electrodes 304, 306, and between the feed rods 338 and the heaters 340a, 340b can include solid terminals/studs/sockets as disclosed in commonly-assigned U.S. Pat. No. 9,088,085, the disclosure of which is hereby incorporated by reference. During manufacture of the platen 300, the tube 330 and feed rods 336, 338 can be bonded to the platen 300 and electrodes 302, 304, 306 via suitable sintering and/or brazing techniques.

Figure 8:
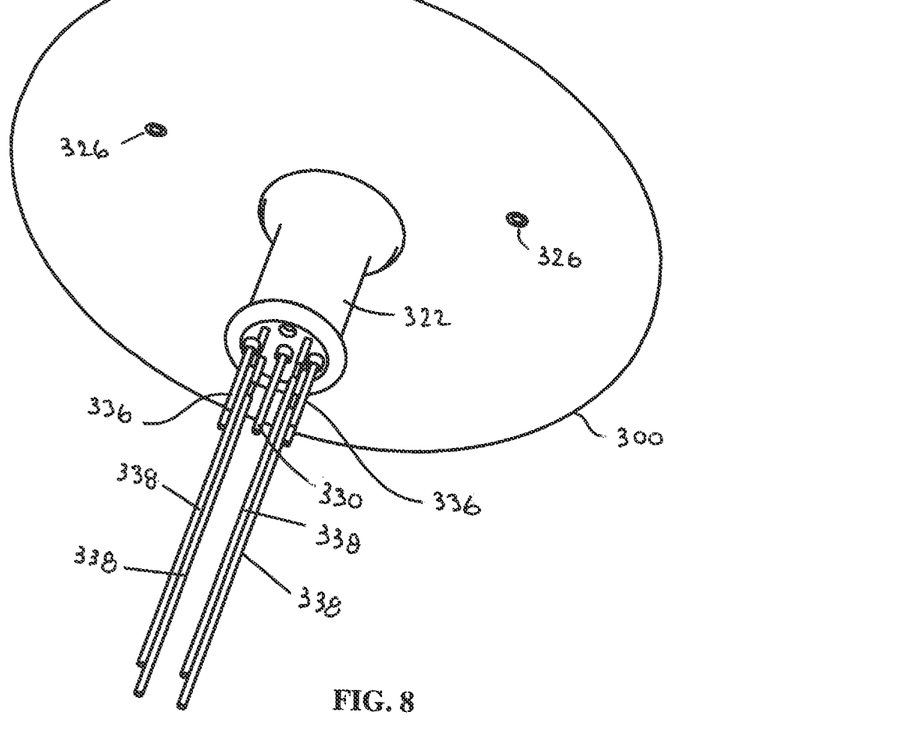
FIG. 8 is a perspective view of an underside of the platen shown in FIG. 5.

FIG. 8 shows a bottom perspective view of the substrate support pedestal 106. As shown, central tube 330, feed rods 338 and outer tubes 336 extend outward from a lower end of the stem 322.

Figure 9:
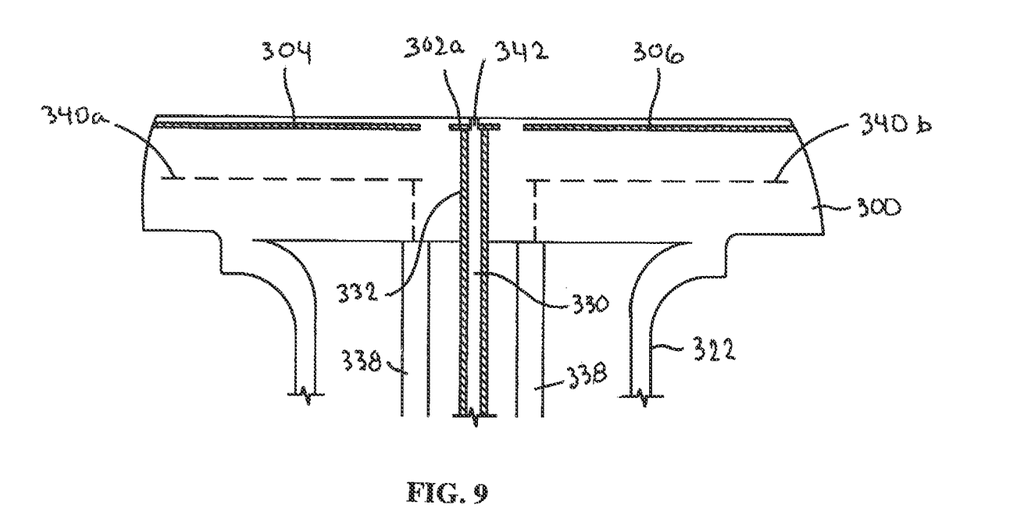
FIG. 9 is a cross section of the platen shown in FIG. 5.

FIG. 9 is a cross-sectional view of the substrate support pedestal 106. As shown, the central tube 330 is electrically connected to feed strip electrode 302a and two feed rods 338 are electrically connected to one or more resistance heaters 340a, 340b embedded in the platen 300 at a location below the electrodes 302, 304, 306. For instance, a pair of feed rods 338 can be connected to an inner heater and another pair of feed rods 338 can be connected to an outer heater. If desired a single heater or more than two heaters can be embedded in the platen 300 in any desired geometrical arrangement. The central tube 330 supplies gas to an outlet 342 in the upper surface of the platen 300.

While the substrate pedestal module of the semiconductor substrate processing apparatus has been described in detail with reference to specific embodiments thereof, it will be apparent to those skilled in the art that various changes and modifications can be made, and equivalents employed, without departing from the scope of the appended claims.

What is claimed is:

1. A substrate processing apparatus, comprising:
a vacuum chamber including a processing zone in which a substrate may be processed;
a process gas source to contain at least one process gas, the process gas source
including multiple source-gas lines coupled to and in fluid communication with the vacuum chamber to supply a process gas into the vacuum chamber;
a showerhead through which process gas from the process gas source is to be supplied to the processing zone of the vacuum chamber; and
a substrate pedestal including an electrostatic chuck comprising a platen formed from a first ceramic material and having an upper surface configured to support the substrate thereon during processing and a stem formed from a second ceramic material having an upper stem flange that supports the platen, the platen including at least three substantially coplanar electrodes embedded in the platen, the at least one radially extending feed strip is substantially coplanar with the at least two inner electrostatic clamping electrodes, the at least three electrodes including an outer radio-frequency (RF) electrode located near an outer periphery of the platen and at least two inner electrostatic clamping electrodes substantially coplanar with the outer RF electrode and located within and electrically isolated from each other and the outer RF electrode, the outer RF electrode comprising a ring-shaped electrode and having at least one radially extending feed strip, which extends diagonally across the platen to a central portion of the platen, the at least one radially extending feed strip comprising a power feed strip having a terminal at a center portion of the underside of the platen thereby reducing disturbances in the RF field above the substrate during processing.

2. The substrate processing apparatus of claim 1, wherein the platen includes the at least two inner electrostatic clamping electrodes comprising first and second D-shaped electrostatic clamping electrodes inward of the ring-shaped electrode, the at least one radially extending feed strip extending diagonally across the platen and coupled to the ring-shaped electrode at two locations about 180° apart with the first and second D-shaped electrodes on opposite sides of the at least one radially extending feed strip.

3. The substrate processing apparatus of claim 2, wherein the platen includes a first terminal at a center of the platen, a second terminal radially offset from the first terminal, and a third terminal radially offset from the first terminal, the first terminal being coupled electrically to the at least one radially extending feed strip of the ring-shaped electrode, the second terminal electrically coupled to the first D-shaped electrode and the third terminal electrically coupled to the second D-shaped electrode.

4. The substrate processing apparatus of claim 3, wherein the first, second and third terminals extend axially through openings in the platen and the second and third terminals are aligned along a diagonal line passing through the location of the first terminal.

5. The substrate processing apparatus of claim 1, wherein at least one physical parameter is selected from parameters including (a) the platen is made of aluminum nitride and the electrodes are made of tungsten, (b) the platen includes three through holes configured to receive lift pins, and (c) the platen has a diameter of at least about 300 mm.

6. The substrate processing apparatus of claim 1, further comprising substantially coplanar resistance heaters embedded in the platen at a location beneath the at least three substantially coplanar electrodes, each of the resistance heaters being coupled to terminals extending from an underside of the platen and the substantially coplanar electrodes coupled to terminals extending from the underside of the platen, the terminals of the resistance heaters and the terminals of the electrodes coupled to axially extending feed rods located inside the ceramic stem, the feed rods extending beyond a lower end of the ceramic stem.

7. The substrate processing apparatus of claim 1, wherein the platen further includes third and fourth electrostatic clamping electrodes inward of the ring-shaped electrode, the at least one radially extending feed strip comprising two feed strips extending diagonally across the platen, each of the feed strips being coupled to the ring-shaped electrode at two locations about 180° apart, the feed strips intersecting at the center of the platen with the at least two inner electrostatic clamping electrodes and the third and fourth electrostatic clamping electrodes located between the diagonally extending feed strips.

8. The substrate processing apparatus of claim 2, wherein the ring-shaped electrode is separated from the D-shaped electrodes by a first continuous wall of ceramic material extending around the first D-shaped electrode and a second continuous wall of ceramic material extending around the second D-shaped electrode, the first and second walls having about the same width, and the width of the first and second walls of ceramic material is less than a width of the radially extending feed strip.

9. The substrate processing apparatus of claim 1, further comprising substantially coplanar resistance heaters embedded in the platen at a location beneath the substantially coplanar electrodes, each of the resistance heaters being coupled to a pair of terminals extending axially through openings in the platen.

10. An electrostatic chuck, comprising:
a platen of ceramic material having an upper surface configured to support a substrate thereon during processing; and
at least three substantially coplanar electrodes embedded in the platen, the at least three substantially coplanar electrodes including an outer radio-frequency (RF) electrode located near an outer periphery of the platen and at least two inner electrostatic clamping electrodes substantially coplanar with the outer RF electrode and located within and electrically isolated from one another and the outer RF electrode, the outer RF electrode including a ring-shaped electrode and having at least one radially extending feed strip, which extends diagonally across the platen from the ring-shaped electrode, between the at least two inner electrostatic clamping electrodes, to a central portion of the platen, the at least one radially extending feed strip is substantially coplanar with the at least two inner electrostatic clamping electrodes, the at least one radially extending feed strip comprising
a power feed strip having a terminal at a center portion of the underside of the platen thereby reducing disturbances in the RF field above the substrate during processing.

11. The electrostatic chuck of claim 10, wherein the platen includes the at least two inner electrostatic clamping electrodes comprising first and second D-shaped electrostatic clamping electrodes inward of the ring-shaped electrode, the at least one radially extending feed strip comprising a single feed strip extending diagonally across the platen and coupled to the ring-shaped electrode at two locations 180° apart with the first and second D-shaped electrodes on opposite sides of the single feed strip.

12. The electrostatic chuck of claim 10, wherein the platen further includes third and fourth electrostatic clamping electrodes inward of the ring-shaped electrode, the at least one radially extending feed strip comprising two feed strips extending diagonally across the platen, each of the feed strips being coupled to the ring-shaped electrode at two locations about 180° apart, the feed strips intersecting at the center of the platen with the at least two inner electrostatic clamping electrodes and the third and fourth electrostatic clamping
electrodes located between the diagonally extending feed strips.

13. The electrostatic chuck of claim 11, wherein the platen includes a first terminal at a center of the platen, a second terminal radially offset from the first terminal, and a third terminal radially offset from the first terminal, the first terminal being coupled electrically to the at least one radially extending feed strip of the ring-shaped electrode, the second terminal electrically coupled to the first D-shaped electrode and the third terminal electrically coupled to the second D-shaped electrode.

14. The electrostatic chuck of claim 10, further comprising substantially coplanar resistance heaters embedded in the platen at a location beneath the substantially coplanar electrodes, each of the resistance heaters coupled to terminals extending axially through openings in the platen.

15. The electrostatic chuck of claim 10, wherein at least one physical parameter is selected from parameters including (a) the platen is made of aluminum nitride and the electrodes are made of tungsten, (b) the platen includes through holes configured to receive lift pins, and (c) the platen has a diameter of at least about 300 mm.

16. The electrostatic chuck of claim 11, wherein the ring-shaped electrode is separated from the first and second D-shaped electrodes by a first continuous wall of ceramic material extending around the first D-shaped electrode and a second continuous wall of ceramic material extending around the second D-shaped electrode, the first and second walls having about the same width.

17. The electrostatic chuck of claim 16, wherein the width of the first and second walls of ceramic material is less than a width of the at least one radially extending feed strip.

18. A substrate support device, comprising:
a platen comprising a ceramic material having an upper surface configured to support a substrate thereon during processing, the platen including at least three substantially coplanar electrodes embedded in the platen, the at least three substantially coplanar electrodes including an outer radio-frequency (RF) electrode located near an outer periphery of the platen and at least two inner electrostatic clamping electrodes substantially coplanar with the outer RF electrode and located within and electrically isolated from one another and the outer RF electrode, wherein the outer RF electrode comprises a ring-shaped electrode and has at least one radially extending feed strip, which extends diagonally across the platen from the ring-shaped electrode, between the at least two inner electrostatic clamping electrodes, to a central portion of the platen, the at least one radially extending feed strip is substantially coplanar with the at least two inner electrostatic clamping electrodes, the at least one radially extending feed strip having a terminal at a center portion of the underside of the platen thereby reducing disturbances in the RF field above the substrate during processing and
a hollow ceramic stem having an upper end diffusion bonded to an underside of the platen.

19. The substrate support device of claim 18, further comprising substantially coplanar resistance heaters embedded in the platen at a location beneath the substantially coplanar electrodes, each of the resistance heaters being coupled to terminals extending from an underside of the platen and the at least three substantially coplanar electrodes coupled to terminals extending from the underside of the platen, the terminals of the resistance heaters and the terminals of the electrodes coupled to axially extending feed rods located inside the hollow ceramic stem, the feed rods extending beyond a lower end of the hollow ceramic stem.

20. The substrate support device of claim 18, wherein the at least three substantially coplanar electrodes includes first and second D-shaped electrostatic clamping electrodes and a ring-shaped electrode, the first and second D-shaped electrostatic clamping electrodes located inward of the ring-shaped electrode, the substrate support device further comprising at least one radially extending feed strip comprising a single feed strip extending diagonally across the platen and coupled to the ring-shaped electrode at two locations about 180° apart with the first and second D-shaped electrodes on opposite sides of the single feed strip.

* * * * *